(12) United States Patent
Parkhe et al.

(10) Patent No.: US 10,079,165 B2
(45) Date of Patent: Sep. 18, 2018

(54) ELECTROSTATIC CHUCK WITH INDEPENDENT ZONE COOLING AND REDUCED CROSSTALK

(71) Applicant: APPLIED MATERIALS, INC., Santa Clara, CA (US)

(72) Inventors: Vijay Parkhe, San Jose, CA (US); Konstantin Makhratchev, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 599 days.

(21) Appl. No.: 14/282,503

(22) Filed: May 20, 2014

(65) Prior Publication Data

US 2015/0340255 A1    Nov. 26, 2015

(51) Int. Cl.
| | | |
|---|---|---|
| *F28F 7/00* | (2006.01) | |
| *G05D 13/00* | (2006.01) | |
| *H01L 21/67* | (2006.01) | |
| *H01L 21/683* | (2006.01) | |
| *F28F 3/12* | (2006.01) | |

(52) U.S. Cl.
CPC .... *H01L 21/67109* (2013.01); *H01L 21/6831* (2013.01); *F28F 3/12* (2013.01)

(58) Field of Classification Search
CPC ...... F28F 3/12; H01L 23/473; H01L 21/6831; H01L 21/6833
USPC .................................................. 165/80.4, 287
See application file for complete search history.

(56) References Cited

U.S. PATENT DOCUMENTS

| | | | | |
|---|---|---|---|---|
| 8,472,188 B2* | 6/2013 | Horiuchi | ............ | H05K 7/20927 165/80.4 |
| 2002/0153607 A1* | 10/2002 | Hiramatsu | ........ | H01L 21/67103 257/701 |
| 2003/0160568 A1* | 8/2003 | Arai | .................. | H01J 37/32724 315/111.21 |
| 2004/0071945 A1* | 4/2004 | Ito | .......................... | B32B 18/00 428/209 |
| 2004/0187787 A1* | 9/2004 | Dawson | .............. | C23C 16/4586 118/728 |
| 2004/0194941 A1* | 10/2004 | Larrieu | ..................... | F02K 9/64 165/170 |
| 2008/0170969 A1* | 7/2008 | Yoshioka | .......... | H01L 21/67109 422/109 |
| 2009/0097184 A1* | 4/2009 | Buchberger, Jr. | ... | H01L 21/6831 361/234 |
| 2010/0321856 A1* | 12/2010 | Peitzsch | .............. | H01L 21/6831 361/234 |
| 2012/0261097 A1* | 10/2012 | Zaffetti | ................. | H01L 23/473 165/104.28 |
| 2013/0112383 A1* | 5/2013 | Hanamachi | ....... | C23C 16/45565 165/170 |
| 2013/0319643 A1* | 12/2013 | Mowry | ............. | H05K 7/20872 165/168 |

* cited by examiner

*Primary Examiner* — Jason Thompson
(74) *Attorney, Agent, or Firm* — Schwabe, Williamson & Wyatt, P.C.

(57) ABSTRACT

An electrostatic chuck is described with independent zone cooling that leads to reduced crosstalk. In one example, the chuck includes a puck to carry a substrate for fabrication processes, and a cooling plate fastened to and thermally coupled to the ceramic puck, the cooling plate having a plurality of different independent cooling channels to carry a heat transfer fluid to transfer heat from the cooling plate.

20 Claims, 7 Drawing Sheets

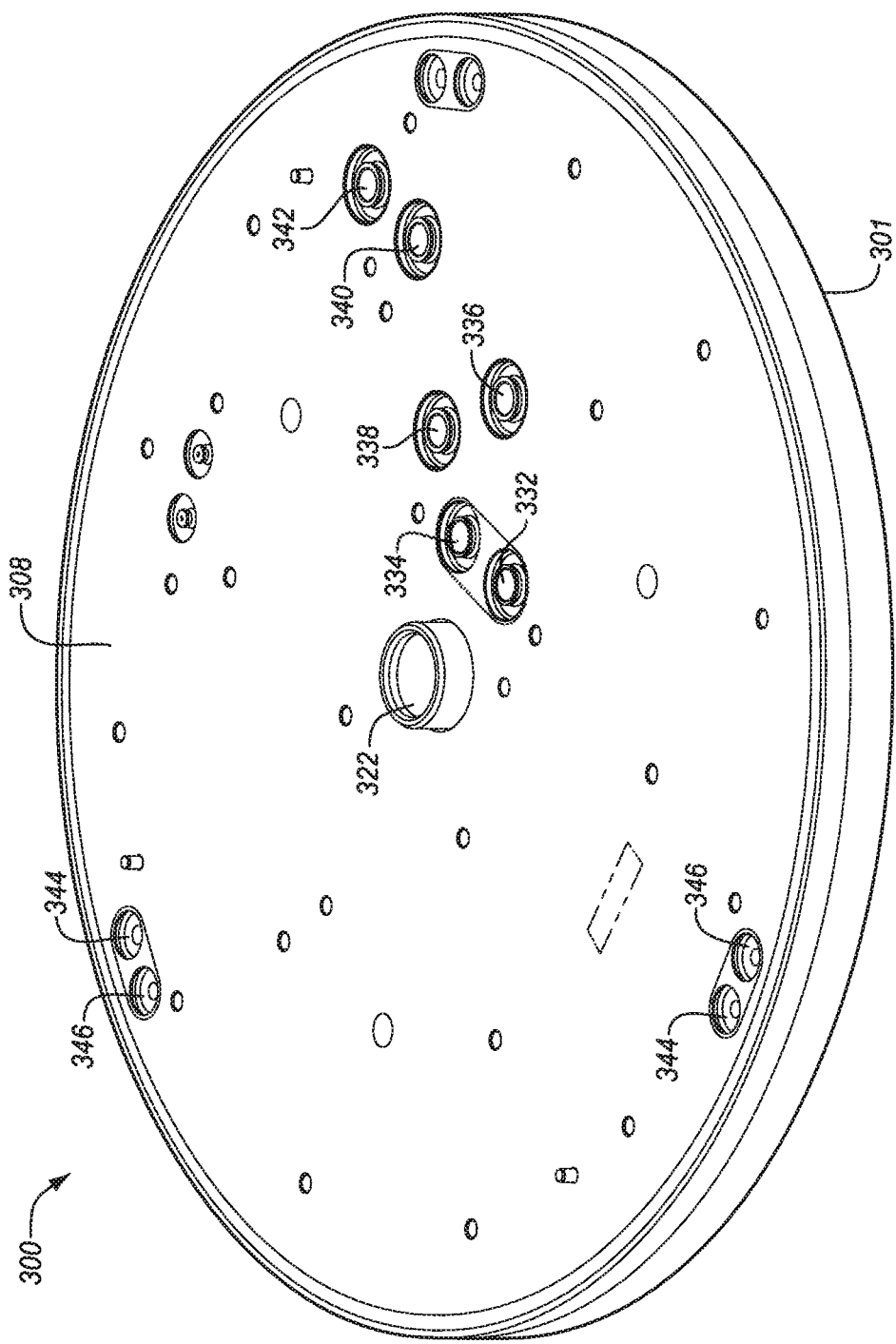

ELECTROSTATIC CHUCK WITH INDEPENDENT ZONE COOLING AND REDUCED CROSSTALK

TECHNICAL FIELD

Embodiments of the present invention relate to the microelectronics manufacturing industry and more particularly to temperature controlled chucks for supporting a workpiece during plasma processing.

BACKGROUND

In the manufacture of semiconductor chips a silicon wafer or other substrate is exposed to a variety of different processes in different processing chambers. The chambers may expose the wafer to plasmas, chemical vapors, metals, laser etching, and various deposition and acid etching processes in order to form circuitry and other structures on the wafer. During these processes, the silicon wafer may be held in place by an electrostatic chuck (ESC). The chuck holds the wafer by generating an electrostatic field to clamp the back side of the wafer to a flat surface or puck surface of the chuck.

As fabrication techniques for plasma processing equipment advance, such as those designed to perform plasma etching of microelectronic devices and the like, the temperature of the wafer during processing becomes more important. ESCs have been designed for thermal uniformity across the surface of the substrate, sometimes called a workpiece. ESC's have also been designed for thermal non-uniformity across the surface of the wafer substrate.

ESCs use liquid cooling to absorb the plasma power heat and remove it from the chuck. An ESC may also include independently controlled heaters in multiple zones. This allows for a wider process window under different process and plasma conditions.

In semi-conductor etch processing, the temperature of a wafer during processing influences the rate at which structures on the wafer are etched. Other processes may also have a temperature dependence. This temperature influence is present, for example, in conductor etch applications in which very precise wafer temperature control helps to obtain a uniform etch rate. A more precise thermal performance allows for more precisely formed structures on the wafer. Controlled uniform and non-uniform etch rates across the wafer allow smaller structures to be formed on the wafer. Thermal performance or temperature control is therefore a factor in reducing the size of transistors and other structures on a silicon chip.

SUMMARY

An electrostatic chuck is described with independent zone cooling that leads to reduced crosstalk. In one example, the chuck includes a puck to carry a substrate for fabrication processes, and a cooling plate fastened to and thermally coupled to the ceramic puck, the cooling plate having a plurality of different independent cooling channels to carry a heat transfer fluid to transfer heat from the cooling plate.

BRIEF DESCRIPTION OF THE DRAWINGS

Embodiments of the present invention are illustrated by way of example, and not limitation, in the figures of the accompanying drawings in which:

FIG. 3B is an isometric bottom view of a base plate of an electrostatic chuck in accordance with an embodiment of the invention;

DETAILED DESCRIPTION

Figure 1:
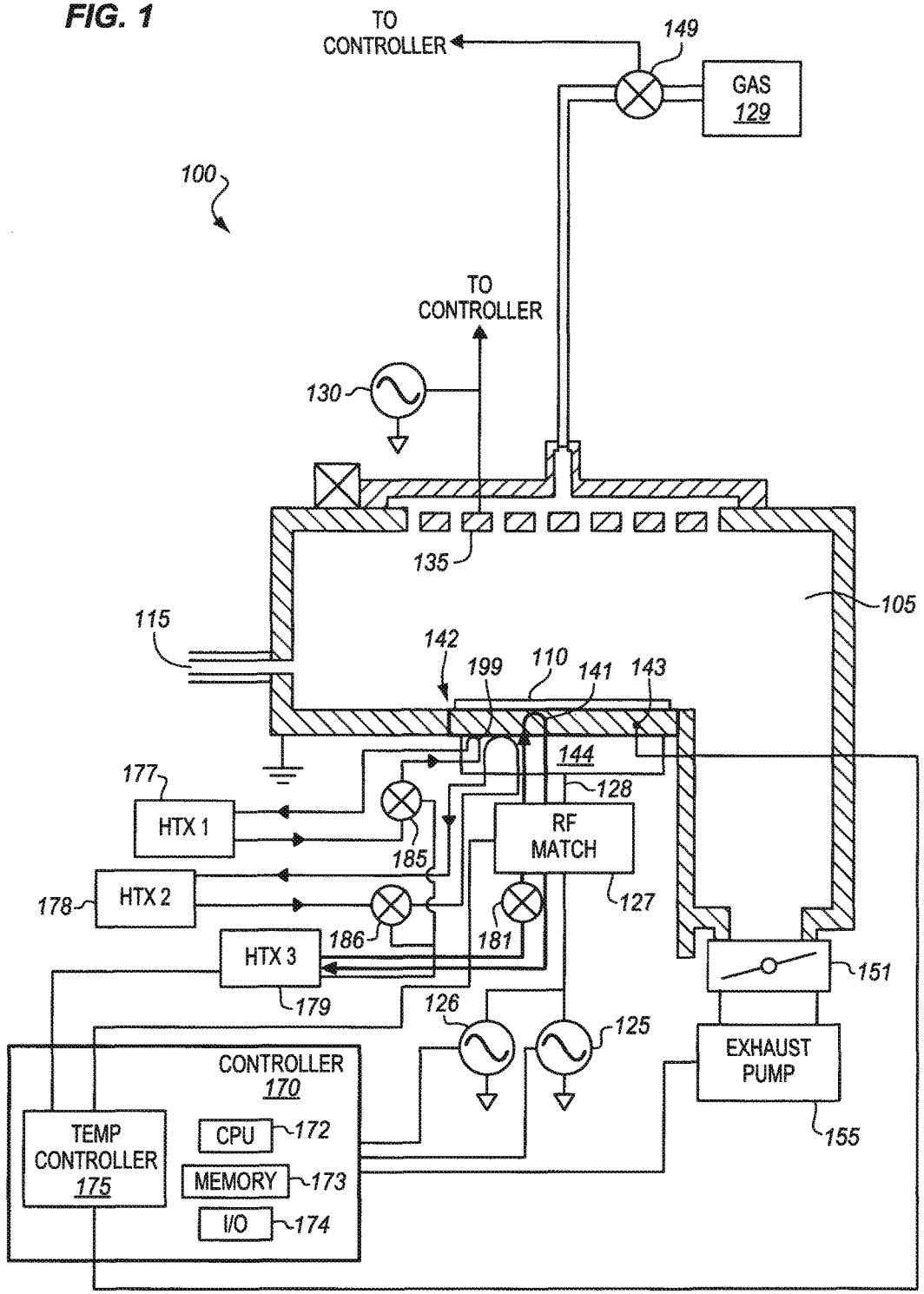
FIG. 1 is a schematic of a plasma etch system including a chuck assembly in accordance with an embodiment of the present invention.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" my be used to indicate that two or more elements are in either direct or indirect (with other intervening elements between them) physical, optical, or electrical contact with each other, and/or that the two or more elements co-operate or interact with each other (e.g., as in a cause an effect relationship).

The terms "over," "under," "between," and "on" as used herein refer to a relative position of one component or material layer with respect to other components or layers where such physical relationships are noteworthy. For example in the context of material layers, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similar distinctions are to be made in the context of component assemblies.

The temperature uniformity across the surface of an ESC has been improved with improved cooling plate and heater designs and improvements in bonding the cooling plate to the puck that holds the workpiece. However, these designs and processes are still subject to manufacturing variations, which can lead to significant thermal non-uniformity. For some implementations, a spatial temperature variation of less than +/−0.3° C. across the wafer is desired. For other implementations, a difference of several degrees is desired from the center of the wafer to the edge.

In some implementations the critical dimensions of features on the wafer are controlled by controlling the temperature of the ESC. The temperature on the edge of a wafer in a plasma chamber may be much higher than the temperature near the center of the wafer. In addition, the temperature around the periphery of the wafer may vary due to inconsistencies in the chamber.

The temperature of the ESC can be more precisely controlled by using a plurality of small heaters, but this requires complex wiring and control systems, at significant cost. In embodiments described herein, a plasma processing chuck includes a plurality of independently controllable cooling zones. The zones are externally controlled by pumps, valves or other components to control the flow of coolant to different areas of the cooling base. A thermocouple or other temperature sensor in or near each cooling zone may be used to determine the temperature of each zone. The temperature value is then used to control the flow of coolant. The thermal performance of the chuck can be improved through the independent adjustment of the different cooling zones in the cooling plate. As described herein, this new cooling plate is simple and can be calibrated, manufactured and used at low cost. The independent cooling zones can be used to correct manufacturing variations, to compensate for chamber and process inconsistencies, and to vary the temperature for different areas of the workpiece.

FIG. 1 is a schematic of a plasma etch system 100 including a chuck assembly 142 in accordance with an embodiment of the present invention. The plasma etch system 100 may be any type of high performance etch chamber known in the art, such as, but not limited to, Enabler™, DPS II, AdvantEdge™ G3, E-MAX®, Axiom, Orion, or Mesa CIP chambers, all of which are manufactured by Applied Materials of California, USA. Other commercially available etch chambers may similarly utilize the chuck assemblies described herein. While the exemplary embodiments are described in the context of the plasma etch system 100, the chuck assembly described herein is also adaptable to other processing systems used to perform any plasma fabrication process (e.g., plasma deposition systems, etc.)

Referring to FIG. 1, the plasma etch system 100 includes a grounded chamber 105. Process gases are supplied from gas source(s) 129 connected to the chamber through a mass flow controller 149 to the interior of the chamber 105. Chamber 105 is evacuated via an exhaust valve 151 connected to a high capacity vacuum pump stack 155. When plasma power is applied to the chamber 105, a plasma is formed in a processing region over a workpiece 110. A plasma bias power 125 is coupled into a chuck assembly 142 to energize the plasma. The plasma bias power 125 typically has a low frequency between about 2 MHz to 60 MHz, and may be, for example, in the 13.56 MHz band. In an example embodiment, the plasma etch system 100 includes a second plasma bias power 126 operating at about the 2 MHz band which is connected to an RF match 127. The plasma bias power 125 is also coupled to the RF match and also coupled to a lower electrode 120 via a power conduit 128. A plasma source power 130 is coupled through another match (not shown) to a plasma generating element 135 to provide high frequency source power to inductively or capacitively energize the plasma. The plasma source power 130 may have a higher frequency than the plasma bias power 125, such as between 100 and 180 MHz, and may, for example, be in the 162 MHz band.

A workpiece 110 is loaded through an opening 115 and clamped to a chuck assembly 142 inside the chamber. The workpiece 110, such as a semiconductor wafer, may be any wafer, substrate, or other material employed in the semiconductor processing art and the present invention is not limited in this respect. The workpiece 110 is disposed on a top surface of a dielectric layer 143 or puck of the chuck assembly that is disposed over a cooling base assembly 144 of the chuck assembly. A clamp electrode (not shown) is embedded in the dielectric layer 143. In particular embodiments, the chuck assembly 142 may include different heater zones, such as a center zone 141 and edge zones 199, each zone 141, 199 may be independently controllable to the same or to different temperature set points.

A system controller 170 is coupled to a variety of different systems to control a fabrication process in the chamber. The controller 170 may include a temperature controller 175 to execute temperature control algorithms (e.g., temperature feedback control) and may be either software or hardware or a combination of both software and hardware. The system controller 170 also includes a central processing unit 172, memory 173 and input/output interface 174. The temperature controller 175 is to output control signals affecting the rate of heat transfer between the chuck assembly 142 and a heat source and/or heat sink external to the plasma chamber 105 for the various heater zones 141, 199.

In embodiments, in addition to the different heaters, there may be different coolant temperature zones. The coolant zones may include separate, independently controlled heat transfer fluid loops with separate flow control that is controlled based on a zone-specific temperature feedback loop. In the example embodiment, the temperature controller 175 is coupled to a first heat exchanger (HTX)/chiller 177 and may further be coupled to a second HTX/chiller 178, a third HTX/chiller 179 and more HTX/chillers (not shown) as desired depending on the particular implementation. The flow rate of the heat transfer fluid or coolant through conduits in the chuck assembly 142 may also be controlled by the heat exchangers.

One or more valves 185, 186 (or other flow control devices) between the heat exchanger/chillers 177, 178, 179 and fluid conduits in the chuck assembly 142 may be controlled by the temperature controller 175 to independently control a rate of flow of the heat transfer fluid to each of the different cooling zones. The temperature controller may also control the temperature set point used by each heat exchanger to cool the heat transfer fluid. Accordingly, each heat exchanger may bring the heat transfer fluid for its respective coolant channel to a different temperature before providing it back to the coolant channel.

The heat transfer fluid may be a liquid, such as, but not limited to deionized water/ethylene glycol, a fluorinated coolant such as Fluorinert® from 3M or Galden® from Solvay Solexis, Inc. or any other suitable dielectric fluids such as those containing perfluorinated inert polyethers. While the present description describes the ESC in the context of a plasma processing chamber, the ESC described herein may be used in a variety of different chambers and for a variety of different processes.

Figure 2:
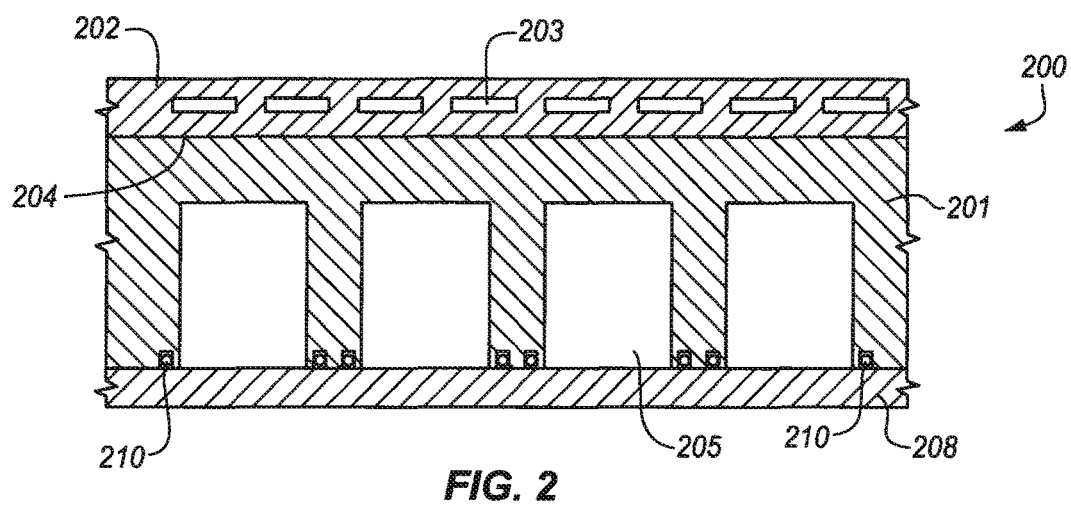
FIG. 2 is a simplified cross-sectional diagram of a portion of an electrostatic chuck in accordance with an embodiment of the invention.

FIG. 2 is a simplified cross-sectional diagram of a portion of an electrostatic chuck (ESC) 200. There are at least four components for regulating the temperature of the chuck surface and therefore the temperature of a wafer (not shown) on the chuck. A cooling plate 201, typically made from a thermally conducting metal, such as aluminum, serves as a heat sink. The cooling plate is bonded to a dielectric puck 202 with a high temperature adhesive 204, such as silicone. The puck is typically ceramic but may alternatively be made with other materials. Electrodes (not shown) are embedded within the puck to generate an electrostatic field with which to grip a workpiece, such as a silicon substrate. Resistive heater traces 203 are also embedded within the puck for temperature control. The heater traces may be divided into separate independently wired sections. This allows for separate heating zones so that different parts of the puck may be heated independently of others.

The cooling plate 201 also includes channels 205 for coolant. Coolant is pumped through the channels to absorb heat from the cooling plate and pumped to a heat exchanger 177, 178, 179 to cool the fluid which is then recirculated back to the cooling plate. The cooling plate may be made from one or more pieces and the channels are separated into different sections that connect to different heat exchangers. This allows the amount of cooling to be adjusted differently for each section. In the example described herein the cooling plates are arranged as concentric rings, only one of which is shown.

The cooling plates are fastened to a base plate 208. The base plate provides a structural reinforcement to the cooling plates and, in this example, seals the cooling channels using an O-ring 210 for each channel. The open-ended construction of the cooling channels as shown allows the cooling plates to easily be machined or cast. The base plate is selected to be formed from a rigid material that has poor thermal conductivity. This prevents heat flow between cooling channels through the base plate. The base plate may be formed from titanium, alumina, ceramic, and similar materials. It may be formed of a single piece or several parts brazed together. The base plate may be bolted, screwed or riveted to the cooling plates, depending on the particular implementation.

The cooling plate absorbs heat from the embedded heaters and the workpiece through the ceramic plate. The temperature uniformity depends on the quality of the ceramic puck 202, the elastomer bond 204, and the cooling plate channels 205. It also depends on how well heat is transferred from the workpiece to the ceramic puck. All of these factors are subject to variations in manufacture and use.

Figure 3A:
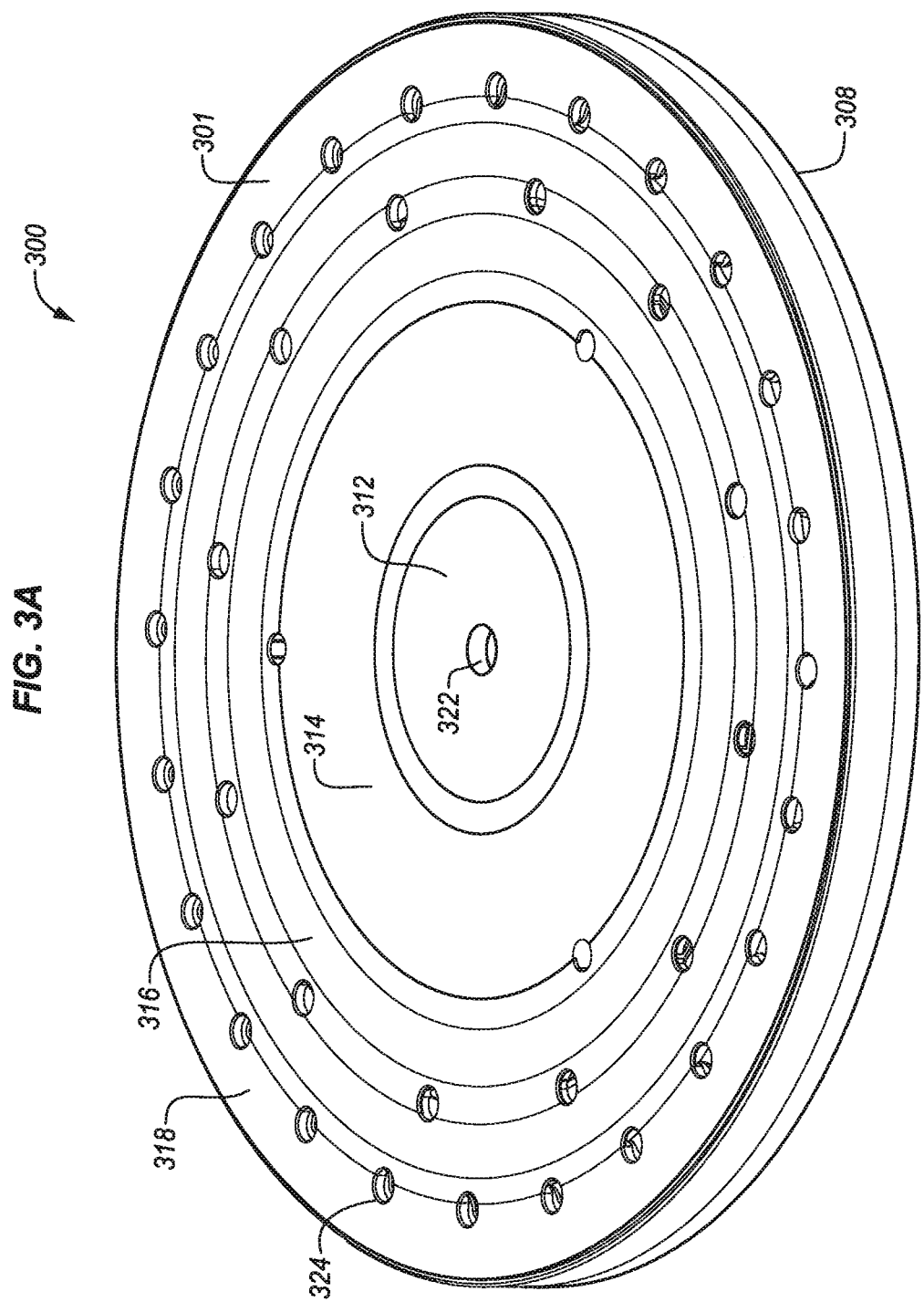
FIG. 3A is an isometric top view diagram of a cooling plate of an electrostatic chuck in accordance with an embodiment of the invention.

FIG. 3A is an isometric top view of an electrostatic chuck (ESC) with the dielectric puck 202 removed. The ESC 300 has a cooling plate 301 and a base plate 308. The cooling plate is made of four annular components, a central part 312, an intermediate part 314 around the central part, a second intermediate part 316 encircling the first intermediate part, and an edge or perimeter part 318 which goes around the entire perimeter of the ESC. The cooling plate has a central opening 322 for attachment to a chuck lift and for the connection of wiring and other connections up to the dielectric puck.

The top surface of the cooling plate also has a plurality of holes 324 around its surface which are covered or open depending upon the particular use of the holes. These holes allow for connections to a variety of different components including a supply of electric charge to hold the wafer to the puck, a supply of nitrogen to the wafer, and for electrical connections.

FIG. 3B is an isometric bottom view of the same ESC 300. The base plate 308 is shown as attached over the bottom of the cooling plate 301. The base plate includes a central hole 322 for connection to the chuck lift and to house and protect connections up to the dielectric puck. The base also has an inlet and an outlet port for each of four different cooling zones. Each cooling zone is part of one of the four parts of the cooling plate. The inner cooling plate 312 (not shown) has an inlet port 332 and an outlet port 334. These ports connect in the cooling plate to coolant fluid channels within the innermost part of the cooling plate. The inlet port and the outlet port also connect to an external heat exchanger so that the coolant can flow in and out of the inner cooling plate.

A second inlet 336 and outlet port 338 are coupled to the cooling channels of the first intermediate portion of the cooling plate 314. A third inlet 340 and outlet 342 are coupled to the cooling channels within the second intermediate cooling plate 316 and a fourth inlet 344 and outlet 346 are coupled to the cooling channels within the fourth outermost cooling plate part 318. By providing separate cooling ports for each of the portions of the cooling plate, the temperatures of the coolant in each of the four parts of the cooling plate can be independently controlled. Each part of the cooling plate can be independently supplied with its own heat exchanger which can independently control the temperature of that part of the cooling plate.

As shown, the outer cooling plate has three different inlet outlet port sets so that the cooling channel in the outer plate is divided into three segments. This allows for the coolant temperature of the outer edge of the wafer to be better controlled. Due to the longer distance of the outer cooling channels, the distance from inlet to outlet is farther than for the inner parts of the cooling plate. The coolant may significantly increase in temperature in traveling all the way around the cooling plate. The division of this cooling channel into three parts by providing separate inlet and outlet ports prevents one side of the outer cooling channel from being a different temperature from the other side of the outer coolant channel.

The base plate 308 also has a plurality of bolt holes to allow the base plate to be bolted to the cooling plate 301. In addition there are other access ways and ports for wiring and other components to extend through the base plate to the cooling plate or to the dielectric puck. As shown, the inlet and outlet ports of the cooling channels are visible through the base plate due to openings in the base plate exposing these ports. Alternatively, there may be connectors to pathways through the base plate depending on the particular implementation.

Figure 4:
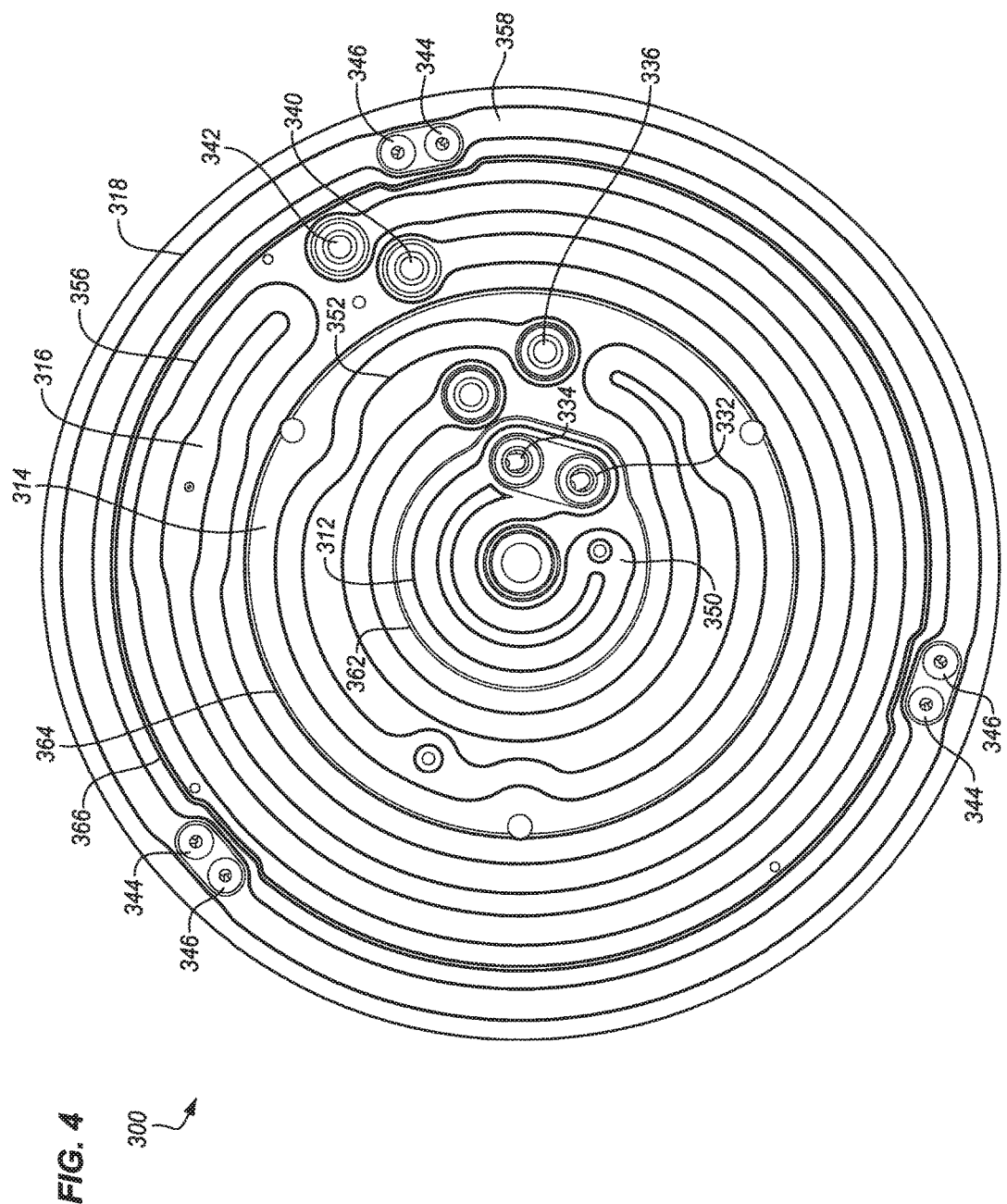
FIG. 4 is a top plan view of the bottom of a cooling plate of an electrostatic chuck in accordance with an embodiment of the invention.

FIG. 4 shows the ESC 300 of FIGS. 3A and 3B with the base plate removed. FIG. 4 is a bottom plan view of the base plate that makes the cooling channels visible. The cooling plate, as mentioned above, is formed from four independent pieces. The central part 312 has a central cooling channel 350, with an inlet port 332 and an outlet port 334. As shown, coolant enters into the inlet port 332, circles around the center of the cooling plate and back around the center of the cooling plate to make two circular passes around the center of the cooling plate and then exit the outlet port 334.

Similarly, the first intermediate cooling plate 314 has an inlet port 336 into a cooling channel 352. The coolant fluid circles around the central cooling plate and around the surface of the overall cooling plate and back again to make two complete circles around the intermediate central area of the cooling plate. The coolant then exits from the outlet 336 to another heat exchanger. Similarly, the second intermediate part 316 has a still longer cooling channel 356. This cooling channel has an inlet 340 and an outlet 342 to provide coolant to travel around the cooling plate and back again to recirculate out to a heat exchanger.

Finally, for the outer cooling plate 318 there is a channel 358 around the perimeter of the cooling plate that is divided into three sections. There is an inlet 344 for each section and an outlet 346 for each section. The coolant flows from one inlet port, part of the way around the cooling plate to an outlet port, then into the heat exchanger and back into another inlet port of the outer part so that, in this case, the outer cooling channel makes three trips to the heat exchanger before the coolant flows all the way around the cooling plate. This allows more precise control over the temperature of the perimeter of the cooling plate. In addition, because the outside edge of the ESC and therefore the cooling plate is exposed to more heat within a plasma process chamber than other parts of the ESC closer to the middle of the ESC, more cooling may be required to maintain a desired temperature.

The three parts of the cooling plate are made up of four different pieces. These may be made, for example, in cast aluminum. A single disk of cast aluminum may be cut into four annular parts and then cooling channels as shown may be machined into each part. In FIG. 4 the four parts are not connected but instead there is an air gap between each part. So, for example, there is an air-gap 362 between the inner part of the cooling plate and the first intermediate part of the cooling plate. There is a second air-gap 364 between the two intermediate cooling plates and there is an air-gap 366 between the second intermediate part of the cooling plate and the outer part of the cooling plate. These air-gaps help to prevent the transfer of heat from one cooling plate to the other. The added thermal isolation of the air gaps allows the temperature of the each zone to be controlled more independently of the neighboring zones.

When the ESC is heated in the plasma chamber, the heat from the dielectric puck will be absorbed by each respective part of the cooling plate. The cooling plate parts are made of a material with a high thermal conductivity, such as aluminum or some other metal. This allows the heat to be transferred from the aluminum cooling plate into the coolant fluid in the cooling channels. The air gap between each part of the cooling plate inhibits the transfer of heat between each part of the coolant plate. Due to this air gap, and because the dielectric puck is a poor thermal conductor, the temperature of the dielectric puck can be divided into four zones, one corresponding to each of the four parts of the cooling plate. Using the air gap or any other kind of low thermal conductivity divider between each cooling plate, the temperature of each part of the cooling plate can be isolated from each other part. The air gap reduces the thermal crosstalk between four parts of the cooling plate. This allows for more precise control of the four different areas of the puck.

In addition, for the outer perimeter, because there are three separate parts of the outer cooling channel 358, the temperature of each of these parts can be independently controlled. Accordingly, an outer perimeter of the dielectric puck through one 120° arc can be maintained at one temperature through that part of the cooling channel while a different 120° arc can be maintained at a different temperature using a different part of the cooling channel. The outer cooling channel may be temperature controlled by one heat exchanger or a different heat exchanger may be used for each part.

While an aluminum plate with air spaces between each part is described herein, the cooling plate may be made of a variety of different materials with a high thermal conductivity. The interface between each of the four parts may be an air gap as described or the four parts may be joined together using a low thermal conductivity material such as an adhesive, a ceramic, or some other part. The four parts of the cooling plate may be held in place with air gaps between them by fastening the four parts to the base plate. This may be done using bolts 376 (see FIG. 6) into the base plate, for example. Any of a variety of other fastening techniques may be used, depending on the materials and the stresses of the plasma chamber, among other criteria. The base plate may be used to provide structural support and rigidity to the cooling plate.

Figure 5:
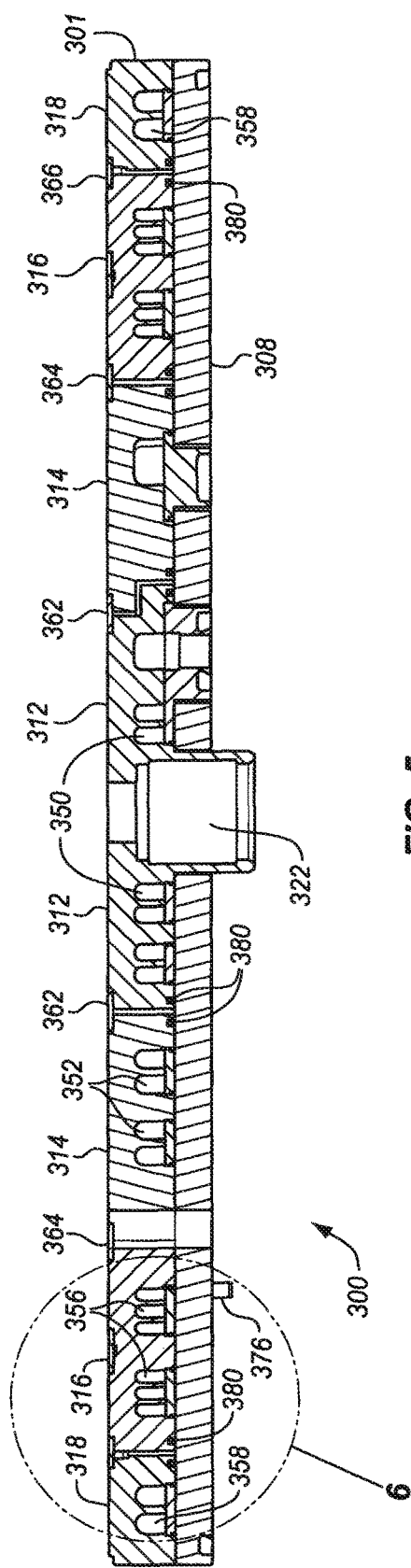
FIG. 5 is a side cross-sectional view of an electrostatic chuck in accordance with an embodiment of the invention.

FIG. 5 is a cross-sectional view of the ESC 300 of FIG. 3A. The cooling plate 301 is shown on top and the base plate 308 is shown beneath. FIG. 4 shows the central opening 322 which extends through the base plate and the cooling plate to allow connections from the ESC lift to the dielectric puck and to the wafer. The four parts of the cooling plate 312, 314, 316 and 318 are shown. As can be seen, these are annular parts where the outer cooling plate part 318 extends all the way around the circumference of the cooling plate. The cooling channels are machined into each part of the cooling plate and are open toward the bottom. The bottoms of the cooling plates are covered by the base plate 308. The gaps 362, 364, 366 between each part of the cooling plate are covered with small covers to provide a flat surface upon which the dielectric puck can be attached.

Figure 6:
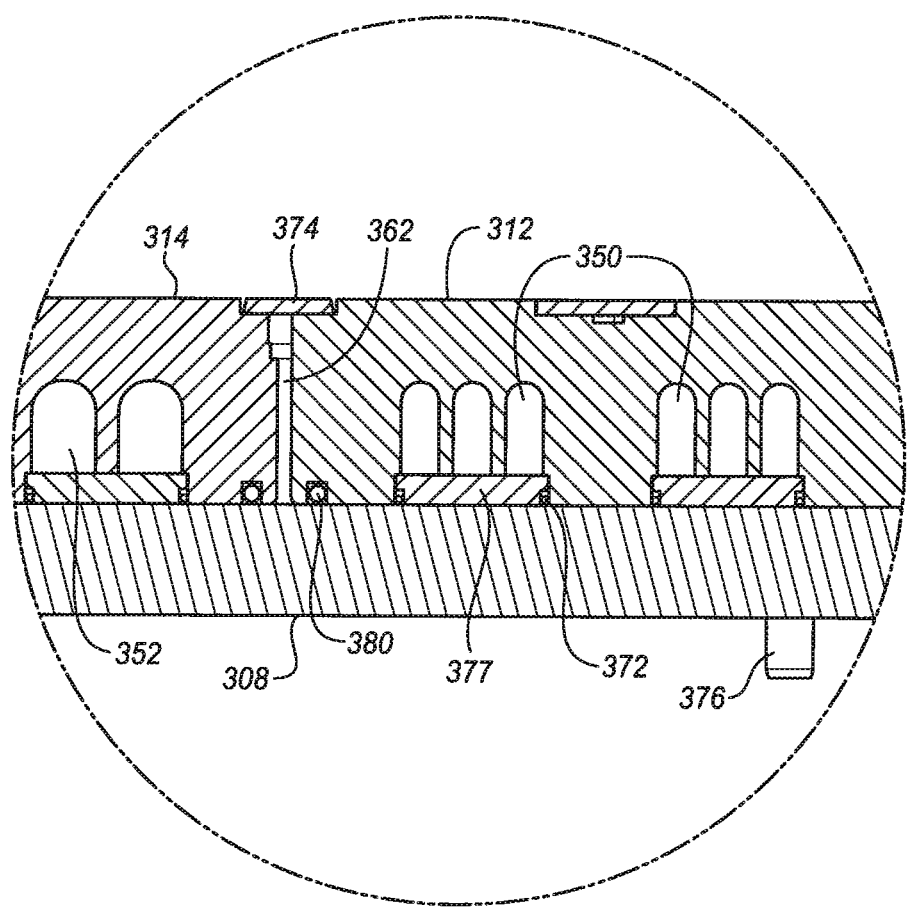
FIG. 6 is an enlarged view of a portion of the view of FIG. 5.

FIG. 6 is an enlarged view of a portion of the cross-sectional diagram FIG. 5. In FIG. 6 the central 312 and first intermediate 314 parts of the cooling plate are shown. In this example the cooling channels 350 of the central part of the cooling plate, are covered with a small circular plate 377. O-ring seals 372 prevent any coolant from leaking from the cooling channel onto the base plate 308.

The gap 362 between the central and first intermediate part of the cooling plate is also shown and this is covered with a small cover 374 to provide a flat surface for the dielectric puck to adhere. The covers are all made from a material with a low thermal conductivity in order to reduce the transfer of thermal energy form one part of the cooling plate to another. Similarly two O-ring seals 380 are optionally used, one on each side of the air gap. This seals the two parts 312, 314 of the cooling plate 301 against the base plate 308. It prevents air from leaking in or out and further isolates the two parts of the plate from each other. These O-rings are particularly useful when the cooling plate and the base plate are made from different metals or metals that do not easily form an airtight bond. A bolt 376 fastens the central part of the cooling plate to the base plate.

The described four zone ESC provides a more precise control of the temperature in each zone than has previously been available. Each zone can be independently controlled by connecting each zone to a different heat exchanger or chiller. The zones are more autonomous because of the bi-metal design. While within each zone, the thermal conductivity is high, there is very little thermal conductivity between zones. Heat from the wafer, the puck and the chamber flows freely into each zone. Within each zone the heat flows freely through the aluminum structure of the cooling plate into the coolant fluid. However, between the cooling zones, a thermal barrier prevents thermal conduction from the aluminum of one part of the cooling plate to the aluminum of another part of the cooling plate. The heat flow is stopped by an air gap or insulating barrier. The base plate and the dielectric puck also provide a very poor path for heat to flow between the zones. This allows for better control of the temperature of each zone. The CD (Critical Dimension) of a feature of a wafer may be reduced due to the more precise level of temperature control.

In addition, since the outer perimeter of the wafer is the most sensitive to temperature variations, the outer perimeter of the cooling plate has three zones within the one outer zone. These zones are each individually controllable to allow even more precision. The shorter path of the outer cooling channels also make the cooling plate quicker to respond to changes in the coolant fluid temperature or flow rate.

While the cooling plate here is shown as having four zones, more or fewer may be used depending on the temperature precision desired for a particular implementation. In addition, while the outer part is shown as having three separate chamber sub-zones, more or fewer or even one single cooling channel may be used. In addition, the cooling channels of the intermediate or central parts of the cooling plate may be separated into separate sub-zones in the same way that the outer part is.

While care has been taken in the illustrated examples to provide a thermal break between the four parts of the cooling plate, there is no specific thermal break between the three sub-zones of the outer part of the cooling plate. Similar measures, such as an air gap or ceramic or other insulating filler may be used to separate the three sub-zones of the outer part of the plate as are used to isolate the four parts of the cooling plate. However, since the thermal interface between the sub-zones is narrow while it is very wide between cooling plate parts, the amount of heat that can flow between the sub-zones is much less. In particular, the cooling channels between sub-zones are arranged end-to-end within the annular cooling plate parts. The cooling channels extend substantially in concentric circles around the center of the ESC and the center of the puck. The concentric circle channel configuration improves flow by providing a gently curving path with no abrupt or small radius turns. Between annular zones, the cooling channels are side-by-side. This would allow heat transfer along the entire length of the two adjacent channels. The thermal break therefore may have a significant impact in reducing cross talk caused by heat flow between the two adjacent channels.

It is to be understood that the above description is intended to be illustrative, and not restrictive. For example, while flow diagrams in the figures show a particular order of operations performed by certain embodiments of the invention, it should be understood that such order is not required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. An apparatus comprising:
   a puck to carry a substrate for fabrication processes;
   a base plate;
   a plurality of cooling plates wherein each cooling plate has a first side fastened to the base plate wherein each cooling plate has a second side thermally coupled to the puck the opposite the first side, each of the plurality of cooling plates completely separated from one another by one or more gaps, each of the cooling plates having an independent cooling channel to carry a heat transfer fluid to transfer heat from the cooling plate; and
   a cover over each of the one or more gaps to provide a flat surface upon which the puck is attached to the plurality of cooling plates.

2. The apparatus of claim 1, wherein each cooling channel comprises a respective input and output port that is configured to be coupled to a different heat transfer fluid loop.

3. The apparatus of claim 1, wherein the cooling channels of each cooling plate are defined by the base plate and a respective one of the plurality of the cooling plates, the apparatus further comprising a plurality of seals to seal the cooling channels against the base plate.

4. The apparatus of claim 3, wherein the base plate has a thermal conductivity less than a thermal conductivity of the cooling plate.

5. The apparatus of claim 1, wherein the one or more gaps define one or more air gaps to thermally insulate each cooling plate.

6. The apparatus of claim 5, wherein each cooling plate is independently fastened to the base plate.

7. The apparatus of claim 6, wherein the cooling plates are attached to the base plate to form concentric rings.

8. The apparatus of claim 6, wherein the plurality of cooling plates has thermal conductivity greater than a thermal conductivity of the base plate.

9. The apparatus of claim 6, wherein the base plate is formed of titanium.

10. The apparatus of claim 6, wherein the plurality of cooling plates includes three concentric cooling plates, each with a different coolant channel, each of the three concentric cooling plates being independently fastened to the base plate so that the portions are isolated from each other by an air gap.

11. The apparatus of claim 1, further comprising an isolating gasket between the cooling plates.

12. The apparatus of claim 1, wherein each cooling plate is annular about a common center.

13. The apparatus of claim 1, wherein the puck is dielectric, the puck further comprising electrodes to electrostatically grip the substrate during the fabrication processes.

14. The apparatus of claim 1, further comprising a plurality of heat exchangers each coupled to a respective independent cooling channel to receive the heat transfer fluid from an output of the respective cooling channel, to cool the heat transfer fluid, and to supply the heat transfer fluid to an inlet of the respective cooling channel.

15. The apparatus of claim 14, further comprising a temperature controller to control the heat exchangers to control a temperature set point used by each heat exchanger.

16. The apparatus of claim 1, further comprising a plurality of heater traces to heat the puck, the puck being for electrostatically gripping the substrate, the substrate being a silicon wafer.

17. The apparatus of claim 1, further comprising embedded temperature sensors in the puck to detect the temperature of the chuck and wherein the flow of heat transfer fluid is adjusted based on the detected temperature.

18. The apparatus of claim 17 wherein the plurality of cooling plates are concentric and wherein adjusting the flow comprises individually adjusting the temperature of each cooling plate to obtain a desired inner and outer temperature of the puck.

19. The apparatus of claim 1, wherein each of the plurality of cooling plates are joined together with a ceramic.

20. The apparatus of claim 1, wherein the plurality of cooling plates is comprises aluminum and the base plate has a thermal conductivity less than a thermal conductivity of the aluminum of the plurality of cooling plates.

* * * * *